United States Patent
Rivoir

(10) Patent No.: US 7,119,720 B2
(45) Date of Patent: Oct. 10, 2006

(54) PRECISION PULSE PLACEMENT TO FORM A BINARY PULSE SIGNAL

(75) Inventor: Jochen Rivoir, Magstadt (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/145,714

(22) Filed: Jun. 6, 2005

(65) Prior Publication Data
US 2006/0028363 A1 Feb. 9, 2006

(30) Foreign Application Priority Data
Aug. 6, 2004 (EP) .................................. 04103816

(51) Int. Cl.
*H03M 5/08* (2006.01)
(52) U.S. Cl. .......................................... 341/53; 341/50
(58) Field of Classification Search ............. 341/50–60
See application file for complete search history.

(56) References Cited

U.S. PATENT DOCUMENTS 6,118,390 A * 9/2000 Chen et al. .................... 341/53
6,212,230 B1 * 4/2001 Rybicki et al. ................ 341/53
6,307,823 B1 * 10/2001 Kobayashi ................ 369/47.19
6,590,509 B1 * 7/2003 Labrie ......................... 341/53
2002/0180547 A1 12/2002 Staszewski et al. ......... 332/115

FOREIGN PATENT DOCUMENTS

DE DE 102 55 352 2/2004

OTHER PUBLICATIONS

XP-002303946: Gwee et al., "A Novel Sampling Process and Pulse Generator for a Low Distortion Digital Pulse-Width Modulator for Digital Class D Amplifiers.", no date.

* cited by examiner

*Primary Examiner*—Lam T. Mai

(57) ABSTRACT

The present invention relates to a method for pulse placement to form a binary pulse signal, said binary pulse signal having a constant pulse rate being reciprocal of a constant pulse rate period, comprising the steps of generating a bit clock having a bit clock period of shorter duration than said constant pulse rate period, synthesizing pulses with leading and trailing edges, said leading and trailing edges of said synthesized pulses being placed at N-multiples of said bit clock period within said constant pulse rate period, with N=0, 1, 2, ..., and selecting said bit clock period individually for successive pulses of said binary pulse signal.

11 Claims, 3 Drawing Sheets

PRECISION PULSE PLACEMENT TO FORM A BINARY PULSE SIGNAL

BACKGROUND OF THE INVENTION

The present invention relates to an improvement of precision pulse placement, in particular for precision pulse placement representing a pulse width modulation (PWM) or pulse position modulation (PPM) for precision analog signal generation using a waveform generator.

Pulse width modulation (PWM) may be used for analog signal generation. While the pulse rate has to be kept constant, signal processing calculates the ideal pulse width. The ideal pulse width depends upon the analog signal to be generated and may be found using natural sampling, click modulation, zero position coding (ZePoC) or uniform sampling.

Knowing the ideal pulse width it is usually quantized to the nearest multiple of a high frequency bit clock resulting in a realized pulse width, which is different from the ideal pulse width. As a consequence of this process a quantization error will arise. The quantization error depends upon the deviation of the ideal pulse width as calculated by signal processing from the realized pulse width. The quantization error will increase according to the deviation between ideal and realized pulse width. In prior art like US 2002/0180547 A1 tabs from a fine buffer delay chain are used to obtain fine timing resolutions.

The quantization error mentioned above can be noise-shaped. To effectively noise-shape the quantization error in a pre-processing algorithm the quantization error caused by the quantization process as described above needs to be well predictable. Fine timing by the use of tabs from a fine buffer delay chain like in US 2002/0180547 A1 does not fulfill this requirement because the delay of single buffers within the buffer delay chain may vary from unit to unit and may not be exactly known in advance. As a consequence noise-shaping in this case may not significantly improve the signal quality.

SUMMARY OF THE INVENTION

It is an object of the invention to provide improved pulse placement, in particular pulse placement for signal synthesis using waveform generators.

The object is achieved as defined by the independent claims. Further embodiments are defined by the dependent claims.

A significantly reduced quantization error will occur when the improved pulse placement is used within a waveform generator using pulse width modulation (PWM) or pulse position modulation (PPM).

There are three important parameters needed to describe the pulse placement, which are related to this invention. The pulse rate defines the number of pulses per time and is constant over time for the invention disclosed here. The pulse rate period (TR) used in this description is just the reciprocal of this parameter. The second parameter is the pulse width (TW), which defines the "on-time" or the duration of the pulse from its leading edge to its trailing edge and ranges from zero to the pulse rate period (TR). The third parameter is the bit clock period (TB), which is usually shorter than the pulse rate period (TR). Times at which the leading edge or the trailing edge of a pulse may occur are spaced at multiples of said bit clock period (TB).

To synthesize the signal for a desired waveform the first step is to decide the desired ideal pulse width. This is done by an algorithm, preferably by natural sampling, uniform sampling, zero position coding (ZePoC) or click modulation. In case sampling or modulation until the end of this step has been ideal the result will be an ideal pulse width.

Zero position coding or click modulation use different ways to determine the ideal pulse width. They still are rounded. The need to accurately place edges and to minimize the quantization error exists in the same way.

The next step is to calculate the pulse width (TW) and bit clock period (TB) to be realized by signal processing. The invention shows a method to achieve a pulse width (TW) very close to the ideal pulse width or in other words to minimize the quantization error. Task of the signal processing is to select a bit clock period (TB) for each pulse such that the quantization error (q) is minimized, while making sure that the pulse rate period (TR) is exactly constant.

Now with the pulse width (TW) and the bit clock period (TB) are known and the pulse rate period (TR) being constant and known, all parameters needed for synthesis of the waveform are known and are stored in a data source. Alternatively they may be calculated by a real-time algorithm or there may be a combination of a real-time algorithm, pre-processing and storage in a data source. The output pulse of the generator now is easily synthesized by using a ramp counter, a width counter, a variable clock source for the bit clock period (TB) and the data source mentioned above. A ramp counter and a width counter are clocked by at least one variable bit clock (the reciprocal of (TB)). The pulse rate period (TR) is set by a controlled ramp counter, while a controlled width counter sets the "on-time" of the pulse. The variable bit clock source may be realized for example as a N/M PLL oscillator or as a direct digital synthesizer (DDS).

The present invention also relates to a software program or product for executing the method for precision pulse placement when running on a data processing system such as a computer. Preferably, the program or product is stored on a data carrier.

Furthermore, the present invention relates to a system for precision pulse placement according to the present invention.

BRIEF DESCRIPTION OF THE DRAWINGS

Other objects and many of the attendant advantages of the present invention will be readily appreciated and become better understood by reference to the following description, taken in conjunction with the accompanying drawings, in the several figures of which like reference numerals identify like elements, and in which.

OVERVIEW OF A PARAMETER DEFINITIONS USED IN THE FOLLOWING DESCRIPTION

Figure 5:
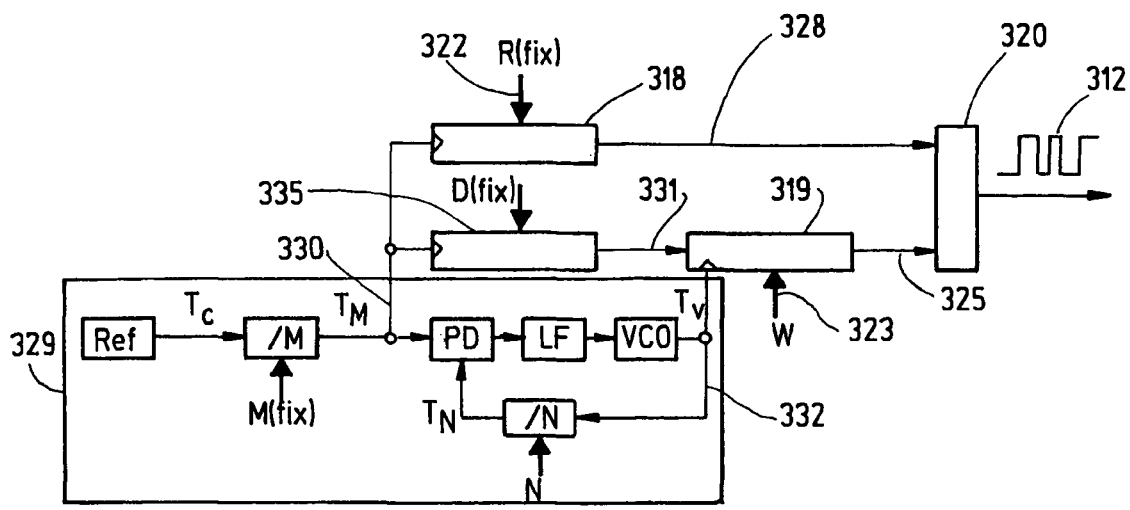
FIG. 5 shows a second embodiment of the invention with a detailed block diagram of a variable bit clock source.

| | |
|---|---|
| 1/TR: | pulse rate |
| TR: | pulse rate period |
| R: | value controlling the ramp counter |
| TW: | pulse width |
| TWi: | pulse width of individual pulses (TW1 for pulse 1, TW2 for pulse 2 and so on) |
| W: | value to control the width counter |
| 1/TB: | bit clock frequency |
| TB: | bit clock period |
| TBr: | bit clock period for individual pulses (TB1 for pulse 1, TB2 for pulse 2 and so on) |
| D: | value to control the D counter 335 in FIG. 5 |
| q: | quantization error |
| qi: | quantization error for individual pulses (q1 for pulse 1, q2 for pulse 2 and so on) |
| N, M: | parameters used in the N/M PLL synthesizer in FIG. 5 |
| TC: | period of a reference clock in FIG. 5 |
| TM, TV: | periods of signal 330 and signal 332 in FIG. 5 |

Figure 1:
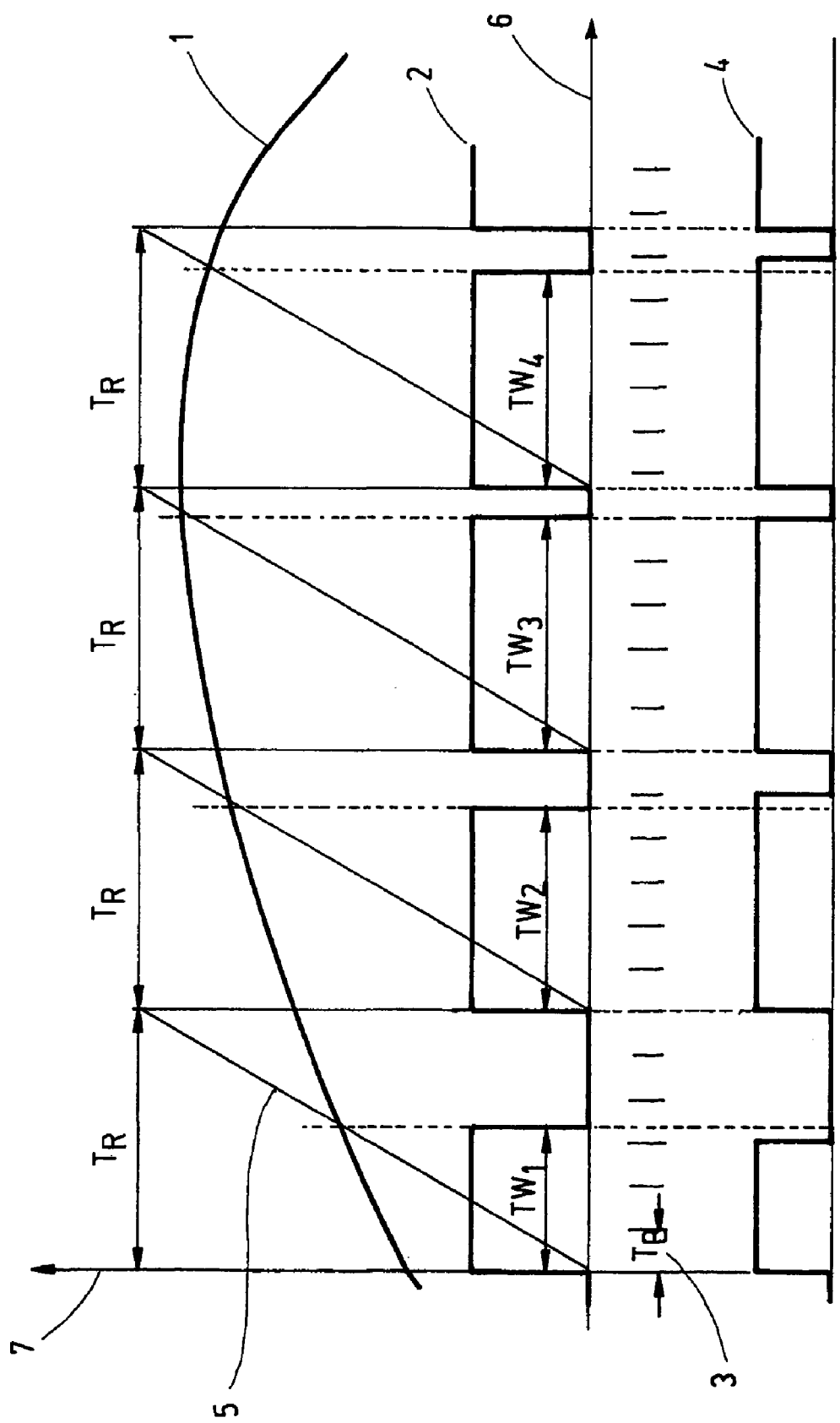
FIG. 1 shows a timing diagram of some of the signals related to pulse placement in the case of natural sampling.

FIG. 1 shows a timing diagram of signals related to the pulse placement in the special case of natural sampling. Time is laid off as abscissa 6, usually called X-axis whereas the signal level is laid off as ordinate 7, usually called Y-axis. As unit of the X-axis the bit clock period (TB) 3 is shown, whereas the signal level at the Y-axis is shown only qualitatively without a unit. Four signals 1, 2, 4 and 5 are shown in the timing diagram.

A ramp 5, increasing from zero to its maximum value within one pulse rate period (TR).

Ideal pulses 2, each individual pulse characterized by having a pulse width TW1, TW2, TW3, TW4. The leading edge of each individual pulse occurs at the same time as the level of the ramp 5 is zero. The trailing edge of each individual pulse occurs after the duration of the individual pulse width TWi, i.e. TW1 for the first pulse, TW2 for the second pulse and so on as shown in FIG. 1.

The analog signal 1 which represents an example of the waveforms generated by the method disclosed in this invention.

The quantized pulses 4 with leading and trailing edges spaced by bit clock periods (TB).

The pulse widths TWi of the ideal pulses are determined by the points in time at which the ramp 5 intersects the analog signal 1. These ideal pulses include no quantization error. As mentioned earlier the pulse rate period TR which is the same as the ramp rate for the ramp 5 shown in FIG. 1 has to be exactly constant over time in accordance with the present invention. The ramp rate is exactly constant, if TR=R×TB. The pulse widths TWi of ideal pulses 2 must be rounded to the quantized pulses 4 in a real system, like the one disclosed by this invention. The timing error thus introduced is +/−0.5×TB, and the average absolute error to be expected is 0.25×TB. This is a consequence of the fact that the edges of the quantized pulses 4 in contrast to the edges of the ideal pulses 2 have to be positioned spaced at multiples of the bit clock period TB.

Figure 2:
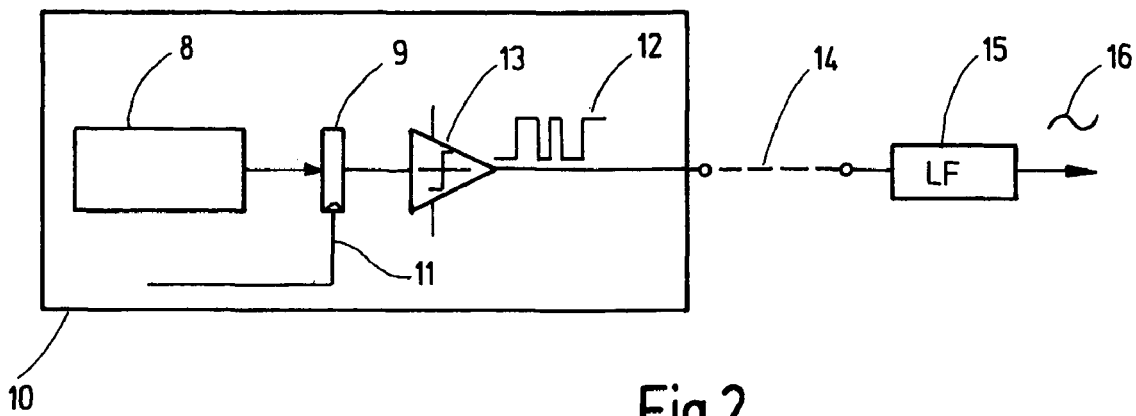
FIG. 2 shows a block diagram of prior art pulse width modulation (PWM)

FIG. 2 shows the block diagram of a prior art pulse width modulator 10. A binary channel 14 and a low pass filter 15 at the end of the binary channel 14 are shown here to visualize the analog signal 16 at the output of the low pass filter 15. All following figures will not include binary channel 14 and low pass filter 15 although binary channel 14 and/or low pass filter 15 may be present in embodiments of the invention.

The generator 10 shown in FIG. 2 comprises a data source 8, a gating device 9 clocked by a fixed bit clock 11 and a clipper-limiter 13 which outputs a pulse width modulated signal 12. A binary channel 14 and the following low pass filter 15 which outputs the analog signal 16 are also shown in FIG. 2. In FIG. 2 the content of the data source 8 is clocked out using the gating device 9 at a fixed bit clock. The following clipper-limiter 13 allows setting the low-level and high-level of the pulse width modulated signal to desired values.

Figure 3:
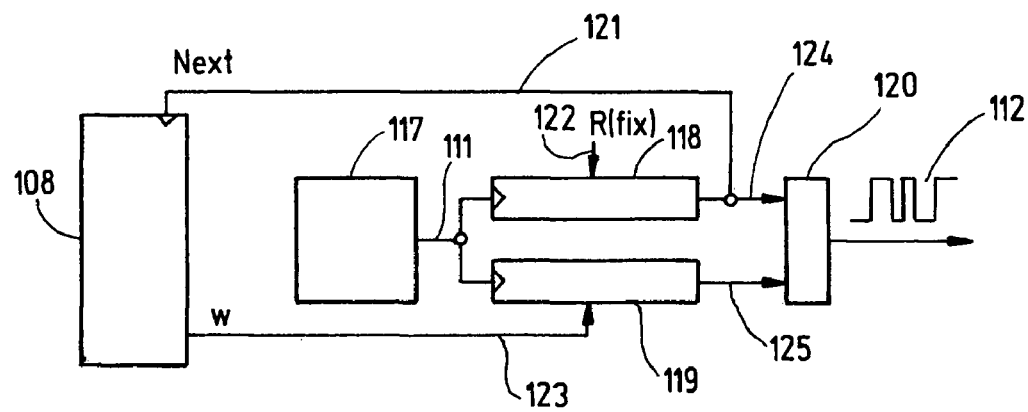
FIG. 3 shows a more detailed block diagram of prior art pulse width modulation (PWM)

FIG. 3 shows a more detailed view of a prior art pulse width modulator. Here the output 111 of a fixed clock source 117 clocks the ramp counter 118 and the width counter 119. Output 124 of counter 118 and output 125 of counter 119 are fed to the pulse forming device 120 which outputs the pulse width modulated signal 112. The ramp counter 118 is controlled by a fixed value R 122, which depends upon the pulse rate. The width counter 119 is controlled by the value W 123. At the end of a pulse rate period TR the next width counter value W needed is clocked out of the data source 108 by the signal "next" from the ramp counter 118 controlling the data source 108.

Figure 4:
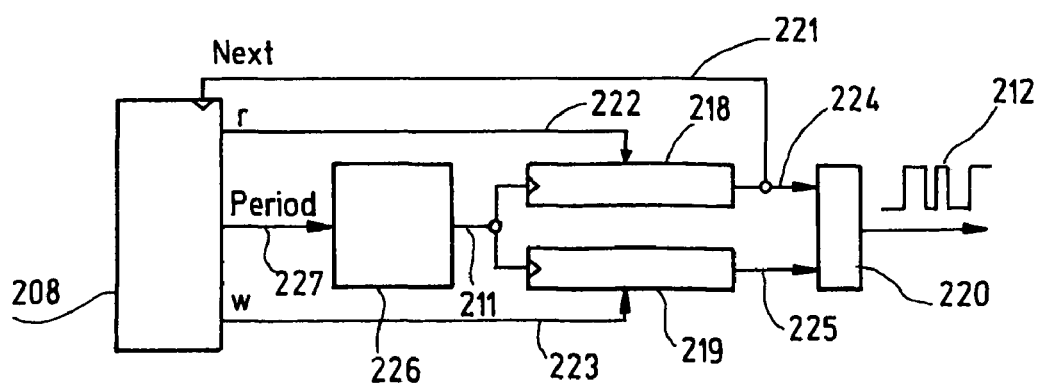
FIG. 4 shows a block diagram of a first embodiment of the invention.

FIG. 4 shows a first embodiment of the present invention. If compared to FIG. 3 it shows differences of the invention disclosed compared to prior art. The fixed clock source 117 of FIG. 3 now is replaced by the variable clock source 226 in FIG. 4. The variable clock period TBr or Period is supplied by the data source 208 to the variable clock source 226 via a line 227. The control value r for the ramp counter 218 now is no longer fixed as in FIG. 3 but is variable too and supplied by the data source 208 via the line 222 The control value w for the width counter 219 is supplied by the data source 208 via the line 223. Output 224 of counter 218 and output 225 of counter 219 are fed to the pulse forming device 220 which outputs the pulse width modulated signal 212. At the end of a pulse rate period TR the next width counter value w and the next control value r needed is clocked out of the data source 208 by the signal "next" 221 from the ramp counter 218 controlling the data source 108.

Instead of using the same continuous bit clock frequency for all ramps, the bit clock period TBr is selected for each pulse (i), such that the quantization error qi is minimized, while making sure that the pulse rate TR is exactly constant. Selecting the bit period TBr individually for each pulse allows the choice of the realized pulse width to be very close to the ideal pulse width, which has been introduced in conjunction with the description of FIG. 1.

A possible pulse position modulation (PPM) algorithm for determining an optimum clock period TBr is shown below:

For each pulse j:
Possible clock periods TBj are:

$$TR = j \cdot TBj; \ j \in J = \{1, \ldots, \text{round } (f_{max} \cdot TR - 0.5)\},$$

wherein TR is the ramp time or pulse rate period and $f_{max}$ is the possible maximum frequency of the clock generator.

The corresponding quantization errors for an ideal pulse width W are:

$$qj = TBj \cdot \text{round } (W/TBj) - W$$

Chose j=r (and therewith chose the clock period TBr) with a minimum quantization error qr:

$$qr \leq qj \text{ for all } j \in J$$

Therewith, the control values triple (r, Period, w) supplied by the data source 208 can be denoted as follows:

(r, TBr=TR/r, w=round (W/TR))

The remaining quantization error can further be noise shaped.

From FIG. 1 it is evident that the ability to change the bit clock TB on a per pulse basis will allow for a much smaller quantization error compared to the quantization error resulting out of a fixed bit clock TB. For example regarding the first and the second pulse in FIG. 1 the first quantized pulse is rounded to a duration of three bit clock periods and is about one third of the bit clock period shorter than the ideal pulse. So for example enlarging the bit clock period for this pulse by about one ninths part of the bit clock period would have allowed to decrease the quantization error for this first pulse. As the second quantized pulse in FIG. 1 is somewhat longer than the ideal pulse, so in this case for example a reduced bit clock period would allow for a decrease of the quantization error. The fourth quantized pulse in FIG. 1 shows the case of a quantized pulse being as long as an ideal pulse, or in other words here a bit clock TB is the best value to minimize the quantization error.

Note that the remaining small quantization error present in embodiments of the present invention is very well predictable and thus may be suppressed within a desired frequency range by the use of noise shaping.

FIG. 5 shows a block diagram of a second embodiment of the present invention using a N/M PLL oscillator 329 providing periods TM 330 and TV 332. The ramp counter 318 is controlled by value R 322 resulting in an output signal 328 representing pulse rate period TR. The D counter 335 is controlled by value D resulting in an output signal 331, representing bit clock period TB. The width counter 319 is controlled by value W 323 resulting in an output signal 325 representing the duration of a single pulse respectively. The output signal 331 of D counter 335 is fed to width counter 319. The output signal 325 of width counter 319 and the output signal 328 of ramp counter 318 are fed into pulse forming device 320, which outputs the pulse signal 312.

The use of a N/M PLL oscillator 329 guarantees for a constant pulse rate period (TR). Furthermore also the bit clock period (TB) can be based on this N/M PLL oscillator 329.

It is advantageous to choose a large value M to obtain many choices of N, but not too large because of settling time. N (and therefore W) is chosen for best quantization error.

The following equations show the dependencies of periods of the signals relevant in FIG. 5:

Ramp time 328: $TR = M \times R \times TC$

Pulse width 325: $TW = M \times (D + W/N) \times TC$

Period 332: $TV = M/N \times TC$

Figure 6:
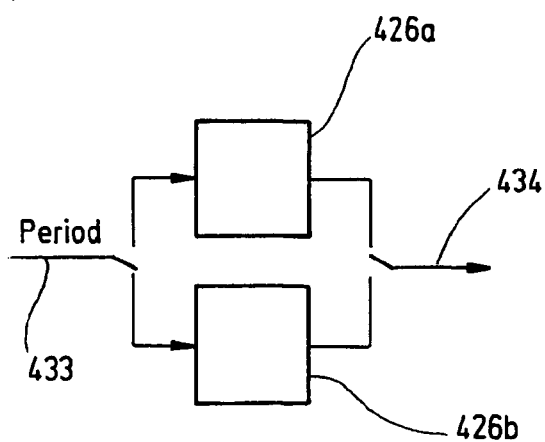
FIG. 6 shows a block diagram of two variable bit clock sources being part of a third embodiment of the invention.

FIG. 6 shows a block diagram of part of a third embodiment of the invention using first and second variable bit clock sources 426a and 426b in so called "ping-pong" mode. First variable clock source 426a is active during the generation of the odd numbered ramps and pulses, while second variable clock source 426b is settling to the new frequency for the even ramps and pulses during the same time. Subsequently second variable clock source 426b becomes active and first clock source 426a is allowed to settle to the frequency needed for the following odd numbered ramp and pulse. The output 434 is switched between variable clock source 426a and variable clock source 426b. The variable clock sources 426a and 426b are controlled by the desired value of the bit clock period 433.

The invention claimed is:

1. A method for pulse placement to form a binary pulse signal of subsequent binary pulses having individual pulse widths, at a constant pulse rate being a reciprocal of a constant pulse rate period, said method comprising:
   generating a bit clock having a bit clock period of shorter duration than said constant pulse rate period,
   synthesizing pulses with leading and trailing edges, said leading and trailing edges of said synthesized pulses being placed at N-multiples of said bit clock period within said constant pulse rate period, with N being any natural number including zero, and
   selecting said bit clock period individually for successive pulses of said binary pulse signal as a function of the corresponding pulse widths.

2. The method of claim 1, wherein selecting the bit clock period is performed by determining for each pulse an ideal pulse width, determining for a plurality of different bit clock periods corresponding quantization errors indicating each the difference between the ideal pulse width and the N-multiple of the bit clock period, and choosing out of the plurality bit clock periods the bit clock period with a minimum quantization error.

3. The method of claim 1, characterized in that said method uses at least two sources supplying said bit clock period, wherein only one bit clock source is used for synthesizing a pulse at a time, while at least one of the further sources is prepared to supply said bit clock period for a subsequent pulse.

4. The method of claim 1, characterized in that said pulse placement represents a pulse width modulation, including leading PWM, trailing PWM and dual sided PWM.

5. The method of claim 1, characterized in that said placement of said leading and trailing edges of said pulses to be synthesized is determined by an algorithm, in particular a pulse width defined by said leading and trailing edges of said pulses to be synthesized is determined by an algorithm, said algorithm preferably includes natural sampling, uniform sampling, zero position coding or click modulation.

6. The method of claim 5, characterized in that said method further comprises noise-shaping of a quantization error, said quantization error is caused by the deviation of realizable pulse widths from ideal pulse widths, wherein said ideal pulse widths are determined by said algorithm.

7. The method of claim 1, characterized in that said method is used for pulse-based signal generation of a predetermined analog signal using a waveform generator.

8. The method of claim 7, characterized in that control data for said waveform generator is either pre-processed and stored in a memory, or provided by a real-time algorithm, or a combination of both, wherein said control data is based on a signal processing which selects said bit clock period for minimum absolute quantization error.

9. The method of claim 1, characterized in that said constant pulse rate period is based on a N/M Phase Locked Loop.

10. A computer readable storage media comprising executable computer program instructions that when executed cause a processing system to perform a method for pulse placement to form a binary pulse signal of subsequent binary pulses having individual pulse widths, at a constant pulse rate being a reciprocal of a constant pulse rate period, wherein said method includes:
   comprising instructions for controlling a processor to execute a method for pulse placement to form a binary pulse signal of subsequent binary pulses signal having individual pulse widths, at a constant pulse rate being reciprocal of a constant pulse rate period, wherein said method includes:

generating a bit clock having a bit clock period of shorter duration than said constant pulse rate period, synthesizing pulses with leading and trailing edges, said leading and trailing edges of said synthesized pulses being placed at N-multiples of said bit clock period within said constant pulse rate period, with N being any natural number including zero, and selecting said bit clock period individually for successive pulses of said binary pulse signal as a function of the corresponding pulse widths.

11. A system for pulse placement to form a binary pulse signal, said binary pulse signal having individual pulse widths, at a constant pulse rate being a reciprocal of a constant pulse rate period, said system comprising:

a generator that generates a bit clock having a bit clock period of shorter duration than said constant pulse rate period, a synthesizer that synthesizes pulses with leading and trailing edges, said leading and trailing edges of said synthesized pulses being placed at N-multiples of said bit clock period within said constant pulse rate period, with N being any natural number including zero, and a selector that selects said bit clock period individually for successive pulses of said binary pulse signal as a function of the corresponding pulse widths.

* * * * *